United States Patent
Harun et al.

(10) Patent No.: US 6,854,637 B2
(45) Date of Patent: Feb. 15, 2005

(54) WIREBONDING INSULATED WIRE

(75) Inventors: Fuaida Harun, Selangor (MY); Kong Bee Tiu, Port Klang (MY)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 10/372,061

(22) Filed: Feb. 20, 2003

(65) Prior Publication Data

US 2004/0164126 A1 Aug. 26, 2004

(51) Int. Cl.[7] .................. B23K 31/00; B23K 31/02
(52) U.S. Cl. .................. 228/180.5; 228/4.5; 257/734; 257/784
(58) Field of Search .................. 228/4.5, 180.5; 219/56.21, 56.22; 257/734, 737, 784

(56) References Cited

U.S. PATENT DOCUMENTS

| | | | | |
|---|---|---|---|---|
| 5,176,310 A | * | 1/1993 | Akiyama et al. | 228/180.5 |
| 6,121,553 A | * | 9/2000 | Shinada et al. | 174/259 |
| 6,472,743 B2 | * | 10/2002 | Huang et al. | 257/717 |
| 6,561,411 B2 | * | 5/2003 | Lee | 228/180.5 |
| 6,713,870 B2 | * | 3/2004 | Fang | 257/734 |
| 2002/0056706 A1 | * | 5/2002 | Trejo | 219/56.22 |
| 2002/0113322 A1 | * | 8/2002 | Terashima et al. | 257/784 |
| 2003/0155660 A1 | * | 8/2003 | Takahashi et al. | 257/777 |
| 2003/0230796 A1 | * | 12/2003 | Ismail et al. | 257/686 |
| 2003/0234275 A1 | * | 12/2003 | Lyn et al. | 228/180.5 |

OTHER PUBLICATIONS

Reid, P. et al., "Providing Stacked Die Solutions with Wedge Bonding Technology", Semicon Singapore 2002, pp. A1–9.

Hadar, Dr. Ilan. Tradeoffs in fine Pitch Bonding Technology. [Online] Available http://kns.com/resources/articles/HDAR2.ASP, Jan. 29, 2003.

Hadar, Dr. Ilan. Increasing Pull–Strength: consistency for Greater Yield. [Online] Available http://www.kns.com/resources/articles/ttpullstregnth.asp, Jan. 29, 2003.

* cited by examiner

*Primary Examiner*—L. Edmondson

(57) ABSTRACT

An electrical connection for connecting a bond pad of a first device and a bond pad of a second device with an insulated or coated wire. The electrical connection includes a first wirebond securing a first portion of the insulated bond wire to the first device bond pad. A second wirebond secures a second portion of the insulated bond wire to the second device bond pad. A bump is formed over the second wirebond, and the bump is offset from the second wirebond. The offset bump enhances the second bond, providing it with increased wire peel strength.

23 Claims, 1 Drawing Sheet

WIREBONDING INSULATED WIRE

BACKGROUND OF THE INVENTION

The present invention relates to wires and wirebonding, and more particularly, to a method of wirebonding insulated wires.

An integrated circuit (IC) die is a small device formed on a semiconductor wafer, such as a silicon wafer. Such a die is typically cut from the wafer and attached to a substrate or base carrier for interconnect redistribution. Bond pads on the die are electrically connected to leads on the carrier via wire bonding. There is a continuing demand for more dense integrated circuits, yet without a corresponding increase in the size or footprint of the IC. There is also a desire for more inputs and outputs to ICs, resulting in high densities of connections between chips and their packages, and the need for fine pitch and ultra-fine pitch wirebonding. As the space between bond pads has decreased to accommodate greater numbers of bond pads, so to has the diameter of the bond wire. For example, 63 um pitch applications use 25 um diameter wire, while 52 um and 44 um pitch applications use 20.3 um diameter wire. Development is being done for a 37 um pitch application using 17 um diameter wire.

Decreases in wire diameter cause difficulties in handling and wirebonding. Parts that use smaller diameter wires tend to have higher wire sweep rejects at the molding stage, which can cause wires to short. Such wire sweep and shortings may be decreased by using insulated or coated wires. However, it is difficult to obtain good bonding quality when using coated wires, especially for the second bond. That is, a wirebonder makes a first bond at the device bond pad and a second bond at the carrier bond pad. Non-sticking on the second bond is a common problem with insulated wire.

The present invention provides a method of using a standard ultrasonic wirebonder that improves the bonding quality of the second bond, thus further enhancing the use of insulated wire for wirebonding applications.

BRIEF DESCRIPTION OF THE DRAWINGS

The foregoing summary, as well as the following detailed description of a preferred embodiment of the invention, will be better understood when read in conjunction with the appended drawings. For the purpose of illustrating the invention, there is shown in the drawings embodiments that are presently preferred. It should be understood, however, that the invention is not limited to the precise arrangements and instrumentalities shown. In the drawings.

DETAILED DESCRIPTION OF PREFERRED EMBODIMENTS

Figure 1:
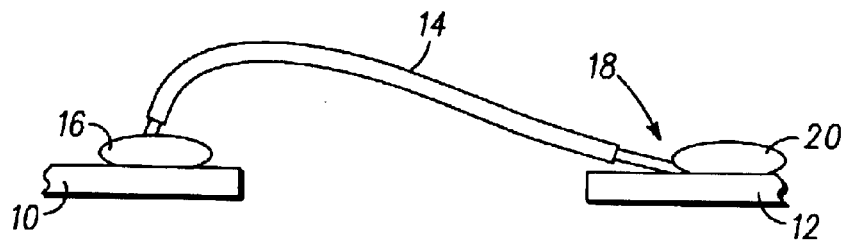
FIG. 1 is an enlarged side view of an electrical connection in accordance with the present invention.

The detailed description set forth below in connection with the appended drawings is intended as a description of the presently preferred embodiment of the invention, and is not intended to represent the only form in which the present invention may be practiced. It is to be understood that the same or equivalent functions may be accomplished by different embodiments that are intended to be encompassed within the spirit and scope of the invention.

Certain features in the drawings have been enlarged for ease of illustration and the drawings and the elements thereof are not necessarily in proper proportion. However, those of ordinary skill in the art will readily understand such details. In the drawings, like numerals are used to indicate like elements throughout.

The present invention is an electrical connection for connecting a bond pad of a first device and a bond pad of a second device. The electrical connection includes a first wirebond that secures a first portion of an insulated bond wire to the first device bond pad. A second wirebond secures a second portion of the insulated bond wire to the second device bond pad. A bump formed over the second wirebond enhances the peel strength of the second wirebond. The bump is offset from a center of the second wirebond, preferably by a distance of about one half of a diameter of the bump. In a preferred embodiment, the bump is formed of gold.

The present invention also provides a method of electrically connecting a first device to a second device. The method includes the steps of forming a first bond, forming a second bond, and forming a bump on the second bond. The first bond is formed by wirebonding a first portion of an insulated wire to a bond pad of the first device, which electrically connects the bond wire and the first device. The second bond is formed by wirebonding a second portion of the insulated wire to a bond pad of the second device, which electrically connects the first device and the second device. The bump formed on the second bond is offset from a center of the second bond.

Referring now to FIG. 1, an enlarged side view of an electrical connection in accordance with the present invention is shown. The electrical connection connects a bond pad 10 of a first device and a bond pad 12 of a second device, thereby electrically connecting the first and second devices. The first device may be a semiconductor device such as an integrated circuit formed on a silicon substrate. The second device may also be a semiconductor device, such as a bottom or lower die in a stacked die configuration. However, in the presently preferred embodiment, the second device is a carrier and the second device bond pad 12 is a lead of the carrier. The first and second devices and their bond pads are of a type known to those of ordinary skill in the art and detailed descriptions thereof are not necessary for a full understanding of the invention.

The electrical connection includes an insulated bond wire 14 having a first wirebond 16 that secures a first portion or end of the insulated bond wire 14 to the first device bond pad 10. A second wirebond 18 secures a second portion of the insulated bond wire 14 to the second device bond pad 12. In the presently preferred embodiment, the first wirebond 16 is a ball bond and the second wirebond 18 is a stitch bond.

The term 'wirebonding' is generally accepted to mean the interconnection, via wire, of chips and substrates. The most frequently used methods of joining the wires to the pads are via either thermosonic or ultrasonic bonding. Ultrasonic wirebonding uses a combination of vibration and force to rub the interface between the wire and the bond pad, causing a localized temperature rise that promotes the diffusion of molecules across the boundary. Thermosonic bonding, in addition to vibration, uses heat, which further encourages the migration of materials. In ball bonding, a capillary holds the wire. A ball formed on one end of the wire is pressed against the face of the capillary. The ball may be formed with a hydrogen flame or a spark. The capillary pushes the ball against the bond pad, and then, while holding the ball against the first pad, ultrasonic vibration is applied, which bonds the ball to the die. This is termed the first bond. Once the ball is bonded to the die, the capillary, which is still holding the wire, is moved over a second bonding pad to which the first pad is to be electrically connected. To form a stitch bond, the wire is pressed against the second pad, forming a wedge-shaped bond. Once again, ultrasonic energy is applied until the wire is bonded to the second pad. The capillary is then lifted off the bond, breaking the wire. This stitch bond is termed the second bond. Both stitch bonding and ball bonding are well known by those of skill in the art.

Although stitch bonding is well known, it is difficult to obtain a good second wire bond when using insulated wire. Oftentimes the weak second bond is due to the wire insulation still existing between the wire and the bonding lead, preventing good adhesion. That is, there is only a small contact area between the wire and the lead, which is at a tail area of the second bond. On the opposite side of the wire, a greater portion of the insulator is taken away during wedge formation. The weak adhesion is evidenced in wire peel test results. In a wire peel test, a hook is placed under the wire proximate to the second bond and a lifting force is applied, thereby testing the strength of the second bond. Insulated fine wire and insulated ultra-fine wire usually exhibit very low wire peel strength. To overcome the low wire peel strength problem, a bump 20 is formed on the second wirebond 18.

Figure 2:
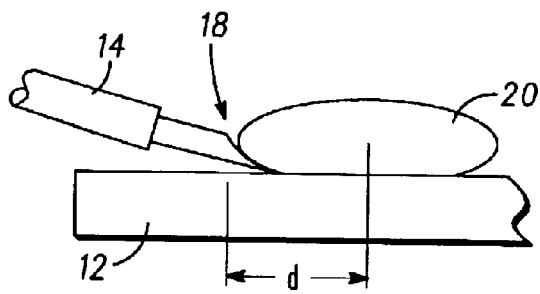
FIG. 2 is an enlarged side view of the second wirebond of FIG. 1.

Referring now to FIG. 2, a greatly enlarged view of the second wirebond 18 is shown. As can be seen, the bump 20 is offset from the second wirebond 18. In a presently preferred embodiment of the invention, the bump 20 is offset by a distance of about one half of a diameter 'd' of the bump 20. The diameter of the bump 20 depends in large part on the diameter of the wire 14 from which it is formed. The bump 20 may have a diameter of about 40 um to about 50 um for a 25 um diameter wire. For example, for 25 um (1 mil) wire, the bump 20 can be controlled to be between about 45–55 um. In order to provide good adhesion, the bump 20 is preferably formed of the same material as the conductive material of the wire 14. For example, if the wire 14 has a gold conductive core, then the bump 20 is preferably formed of gold. In one embodiment of the invention, a 20 um coated gold wire was wirebonded to a 76 um×76 um pad. The bump formed on the pad had a diameter of about 35 um.

The bump 20 may be formed or disposed on the second device bond pad 12 in the same manner that the first wire bond 16 is formed, such as with a hydrogen flame or a high voltage electrical spark. More particularly, a ball is formed on one end of the wire 14 in the wirebonder. The formed ball is pressed against the face of the wirebonder capillary. The capillary pushes the ball against the second wire bond 18, and then, while holding the ball against the pad 12, ultrasonic vibration is applied, which bonds the ball over the second bond 18 and to the pad 12. Once the ball is bonded to the pad 12, the wire above the bonded ball is cut-off by clamping the wire above the capillary while the capillary is being lifted up. The wire area above the ball, which is the weakest spot, will give way, leaving only the bump 20. The bump 20 may be formed using currently available wirebonders, such as the Kulicke & Soffa 8060 Wirebonder, with no modifications to the capillary required.

Figure 3:
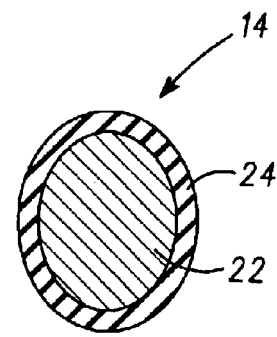
FIG. 3 is an enlarged cross-sectional view of the bond wire of FIG. 1.

FIG. 3 is an enlarged cross-sectional view of the bond wire 14 of FIG. 1. In general, gold and aluminum are the most commonly used elements to make bonding wire. Both gold and aluminum are strong and ductile and have similar resistance in most environments. Gold wire is sometimes doped with a dopant, such as beryllium, calcium in order to stabilize it. Small-diameter aluminum wire is often doped with silicon or sometimes magnesium to improve its breaking load and elongation parameters. In addition to gold and aluminum, copper, palladium-alloy, platinum or silver bonding wire are also known. The bond wire 14 of the present invention comprises a conductive core 22 coated with an electrically insulating material 24 and is suitable for fine pitch and ultra-fine pitch wirebonding. The bond wire 14 has a diameter of less than about 55 um and can be less than 30 um. Preferably, the core 22 comprises gold or copper and the insulating material 24 is an organic insulative coating having a thickness of about 0.5 um to about 2.0 um that can be thermally decomposed during free air ball formation. Further, the wire 14 preferably has a Tg of about 180° to 260° C., where Tg refers to softening temperature, also knows as the glass transition temperature.

Figure 4:
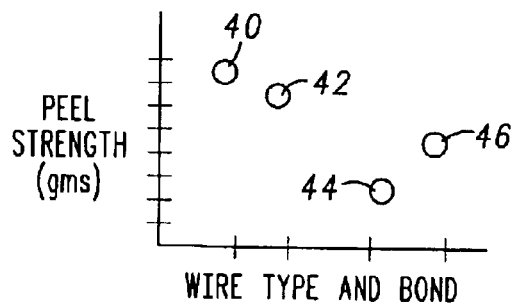
FIG. 4 is graph showing the peel strength for the second bond using various wires and wirebonds.

Referring to FIG. 4, a graph of the peel strength of different wires and wire bonds is shown. Point 40 indicates that the peel strength of a standard 20 um diameter (non-coated) wire using a standard wedge bond is about 7 gms. Point 42 indicates that the peel strength of the standard 20 um diameter (non-coated) wire using a wedge bond and a bump 20 in accordance with the present invention has a peel strength of about 6.5 gms, which is 0.5 gms less than the non-bumped bond. Point 44 indicates the peel strength of a 23 um diameter coated wire using a standard wedge bond. The peel strength is only about 2 gms, which is quite low. In contrast, point 46 indicates the peel strength of the 23 um diameter coated wire using a wedge bond and a bump 20 in accordance with the present invention. The coated wire and bond including the bump 20 has a peel strength of about 5.1 gms, which is a great improvement over the non-bumped bond. However, the result is somewhat surprising in view of the fact that the peel strength decreased for the non-coated wire when the wire bond included a bump.

The present invention has been found to provide the following advantages: (a) near elimination of rejection of parts due to Non-Stick on Lead at the second bond when using insulated wire with a standard wirebonding machine; (b) enhancing the bondability of insulated wire at the second second bond with an increased wire pull/wire peel strength; (c) new or modified wirebonding equipment is not required, nor is any additional upgrade required to remove the insulation on the wire prior to performing the second bond operation; (d) wire shorting rejects at mold have been decreased; (e) an expensive mold compound having a very fine filler is not required; (f) the use of fine coated wire enables cross bonding; and (g) the pad/die design rules do not need to be restricted to peripheral pads only.

The description of the preferred embodiment of the present invention has been presented for purposes of illustration and description, but is not intended to be exhaustive or to limit the invention to the form disclosed. It will be appreciated by those skilled in the art that changes could be made to the embodiment described above without departing from the broad inventive concept thereof. The present invention is applicable to all wire bonded package types, including but not limited to BGA, QFN, QFP, PLCC, CUEBGA, TBGA, and TSOP. It is understood, therefore, that this invention is not limited to the particular embodiment disclosed, but covers modifications within the spirit and scope of the present invention as defined by the appended claims.

What is claimed is:

1. A method of electrically connecting a first device to a second device, the method comprising the steps of:
   forming a first bond by wirebonding a first portion of an insulated wire to a bond pad of the first device, thereby electrically connecting the bond wire and the first device;
   forming a second bond by wirebonding a second portion of the insulated wire to a bond pad of the second device, thereby electrically connecting the first device and the second device; and
   forming a bump on the second bond, and bond pad of the second device, wherein the bump is offset from a center of the second bond.

2. The electrical connection method of claim 1, wherein the bump on the second bond is offset by a distance of about one half of a diameter of the bump.

3. The electrical connection method of claim 1, wherein the bump has a diameter of about 40 to 50 um.

4. The electrical connection method of claim 1, wherein the bump is formed of gold.

5. The electrical connection method of claim 1, wherein the insulated wire comprises one of a gold or copper wire having an organic insulative coating.

6. The electrical connection method of claim 5, wherein the insulated wire has a diameter of less than or equal to about 25 um.

7. The electrical connection method of claim 6, wherein the insulative coating has a thickness of about 0.5 um to 2.0 um.

8. The electrical connection method of claim 7, wherein the insulative coating has a Tg of about 180° to 260° C.

9. The electrical connection method of claim 1, wherein the first bond comprises a ball bond.

10. The electrical connection method of claim 1, wherein the second bond comprises a stitch bond.

11. The electrical connection method of claim 1, wherein the second device comprises a carrier.

12. A method of enhancing the strength of a second wire bond of a coated wire wedge bonded to a lead, the method comprising the steps of:
   forming a bump on the second bond and the lead, wherein the bump is offset from a center of the second bond.

13. An electrical connection for connecting a bond pad of a first device and a bond pad of a second device, the electrical connection comprising:
   a first wirebond securing a first portion of an insulated bond wire to the first device bond pad;
   a second wirebond securing a second portion of the insulated bond wire to the second device bond pad; and
   a bump formed over the second wirebond and on the second device bond pad, wherein the bump is offset from the second wirebond.

14. The electrical connection of claim 13, wherein the bump on the second bond is offset by a distance of about one half of a diameter of the bump.

15. The electrical connection of claim 13, wherein the bump has a diameter of about 40 to 50 um.

16. The electrical connection of claim 13, wherein the bump is formed of gold.

17. The electrical connection of claim 13, wherein the insulated wire comprises one of a gold or copper wire having an organic insulative coating.

18. The electrical connection of claim 17, wherein the insulated wire has a diameter of less than or equal to about 25 um.

19. The electrical connection of claim 18, wherein the insulative coating has a thickness of about 0.5 um to 2.0 um.

20. The electrical connection of claim 17, wherein the insulative coating has a Tg of about 180° to 260° C.

21. The electrical connection of claim 13, wherein the first bond comprises a ball bond.

22. The electrical connection of claim 13, wherein the second bond comprises a stitch bond.

23. The electrical connection method of claim 13, wherein the second device comprises a carrier.

* * * * *